(12) United States Patent
Niitsu et al.

(10) Patent No.: US 8,371,862 B2
(45) Date of Patent: Feb. 12, 2013

(54) CONNECTOR WITH LIQUID DIELECTRIC RESERVOIR

(75) Inventors: Toshihiro Niitsu, Machida (JP); Masako Nishikawa, Yamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 13/146,479

(22) PCT Filed: Feb. 1, 2010

(86) PCT No.: PCT/US2010/022697
§ 371 (c)(1),
(2), (4) Date: Sep. 21, 2011

(87) PCT Pub. No.: WO2010/088584
PCT Pub. Date: Aug. 5, 2010

(65) Prior Publication Data
US 2012/0052700 A1    Mar. 1, 2012

(30) Foreign Application Priority Data

Jan. 30, 2009 (JP) ................................. 2009-019766

(51) Int. Cl.
*H01R 12/00* (2006.01)
(52) U.S. Cl. ........................................ 439/74; 361/327
(58) Field of Classification Search ............. 439/66, 439/591, 620.24, 950; 361/327
See application file for complete search history.

(56) References Cited

U.S. PATENT DOCUMENTS

| | | | |
|---|---|---|---|
| 4,770,641 A | | 9/1988 | Rowlette |
| 5,037,312 A | * | 8/1991 | Casciotti et al. ............. 439/66 |
| 5,074,799 A | * | 12/1991 | Rowlette, Sr. ............... 439/91 |
| 6,836,016 B2 | * | 12/2004 | Marketkar et al. ........... 257/726 |
| 2001/0024888 A1 | | 9/2001 | Marketkar et al. |

FOREIGN PATENT DOCUMENTS

| | | |
|---|---|---|
| JP | 2006-120511 | 5/2006 |
| JP | 2008-262828 | 10/2008 |
| WO | WO 2009/134792 A1 | 11/2009 |

OTHER PUBLICATIONS

International Search Report for PCT/US2010/022697, Jun. 25, 2010.

* cited by examiner

*Primary Examiner* — Tulsidas C Patel
*Assistant Examiner* — Travis Chambers
(74) *Attorney, Agent, or Firm* — Timothy M. Morella (57) ABSTRACT

A connector assembly utilizes capacitive coupling for connecting two substrates. The connector assembly includes first and second connector frames which may be respectively attached to first and second substrates. The first connector frame includes a plurality of first conductors connected to circuits on the first circuit substrate and these conductors have exposed contact surfaces with a dielectric material disposed thereon. The first conductors and associated dielectric material confront second, opposing conductors supported by the second connector frame when the connector frames are engaged together. The first connector frame has a recess formed therein so that its conductors and dielectric material are arranged at a level beneath the top surface of the first connector frame. This recess defines a reservoir and a liquid dielectric material is interposed between the terminals and the dielectric portions in the reservoir, which prevents the liquid dielectric from flowing off the first conductors and dielectric material.

16 Claims, 9 Drawing Sheets

CONNECTOR WITH LIQUID DIELECTRIC RESERVOIR

REFERENCE TO RELATED APPLICATIONS

The Present Application claims priority of prior-filed Japanese Patent Application No. 2009-019766, entitled "Connector With Liquid Dielectric Reservoir," and filed 30 Jan. 2009, the contents of which is fully incorporated in its entirety herein.

BACKGROUND OF THE PRESENT APPLICATION

The Present Application relates to a connector assembly that utilizes capacitive coupling to effect signal transfer between two circuits and which utilizes two distinct dielectric materials, one solid and one liquid, with the liquid material being held within a reservoir.

Conventionally, there is known a connector in which a terminal held in one housing and a terminal held in another housing are arranged spatially apart from each other, as a connector for realizing the capacity-coupling between terminals. An example of such a connector is shown in Japanese Patent Application No. 2002-289309, in which a dielectric portion is arranged between two sets of opposing terminals.

Although such a connector is capable of transmitting electrical signals, it has been discovered that the application of a dielectric material to the terminals is not always done perfectly. That is, there remains often surface roughness in the form of asperities, which prevents close and intimate surface to surface contact. The surface roughness leads to minute, on the level of microscopic scale gaps between the dielectric material and its opposing terminal or conductor. Air can enter these gaps and affect the capacitance that occurs between the two terminals of the connector assembly. The air deleteriously interposes itself between the terminals and the dielectric material, thereby deteriorating the capacitance between the terminals.

Further, a large number of minute asperities exist on surfaces of the terminals and the dielectric material making those surfaces rough so that it is difficult to obtain close, intimate face-to-face contact between the terminals and the dielectric material. Hence, a large number of minute gaps are microscopically formed therebetween, even when the terminals and the dielectric are contacted with each other and air may enter these gaps. Therefore, there is a realized concern that the capacitance between the terminals deteriorates by the presence of air in these gaps.

The Present Application provides a solution to this problem and an advantage over known connectors that utilize capacitive coupling for signal transmission.

SUMMARY OF THE PRESENT APPLICATION

Accordingly, it is a main object of the Present Application to provide a connector assembly which is capable of suppressing deterioration in capacitance between terminals separated by an interposed dielectric material.

In order to solve the above-mentioned problem, a connector according to the Present Application includes: a first connector frame attached to a first circuit substrate; a second connector frame attached to a second circuit substrate; at least one conductor portions supported by the first connector frame and electrically conducted to an electrical circuit of the first circuit substrate, at least one dielectric portion provided on the one conductor portion, characterized in that, when the first and second connector frames are fitted together, the dielectric portion is opposed to one opposing portion provided on the second circuit substrate or second connector, and a liquid dielectric material is interposed gaps between the opposing portions and the dielectric portions.

Further, a terminal holder according to the Present Application includes a plurality of conductors electrically contacting circuits of a first circuit substrate; and dielectric portions provided on the respective conductor portions, characterized in that: the dielectric portions are arranged so as to be opposed to one or a plurality of opposing conductor portions of a second circuit substrate; and a liquid dielectric material is interposed between the dielectric portions and the conductor portions thereby filling gaps occurring between the two dielectric portions.

According to the Present Application, the liquid dielectric material is interposed therebetween so that it fills minute gaps which may occur between the dielectric portions and the opposing conductors, and hence the deterioration in the capacitance between the opposing portion and the conductor portions can be reduced. Further, the liquid dielectric material also reduces the possibility of short circuits between the plurality of opposing conductor portions.

The dielectric portions are held in contact with the opposing conductor portions, and the liquid dielectric material is interposed between them. Because a liquid dielectric material is used, the opposing conductor portions and the dielectric portions can be held in close and intimate contact with each other. As a result, the distance between the opposing conductor portions and the dielectric portions is shortened.

The conductor portions may be formed as plates, and the electrical circuits of one circuit substrate are connected to contact surfaces on one side of the plates and the dielectric portions are provided on contact surfaces on the other side of the plates. With this, it is possible to reduce the height of the connector.

The opposing conductor portions are also formed as plates with electrical circuits connected to contact surfaces on one side of the opposing conductor portion plates, and the dielectric portions come in contact with contact surfaces on the other side. With this, it is possible to reduce the height of the connector.

A recessed portion is formed in the first connector frame and its conductor portions and the dielectric portions associated therewith are dispose in the recessed portion, while the liquid dielectric material is arranged on the dielectric portions. With this, the recessed portion acts as a reservoir and maintains the liquid dielectric therein, and hence the likelihood of the liquid dielectric material from flowing off the dielectric portions is reduced.

Further, the opposing conductor portions of the second connector frame may be inserted into the first connector frame recessed portion and brought into contact with the dielectric portions. With this, the distances between the opposing conductor portions and the conductor portions are reduced. Also, a periphery is provided that extends completely around the recessed portion. With this, it is easy to close off the recessed portion and maintain the liquid dielectric in place until the first connector frame and the second connector frame are fitted together.

A main component of the liquid dielectric material is a glycol-based resin. The glycol-based resin is a material having a relatively high dielectric constant and viscosity similar to that of a gel, which permits it to be applied to the dielectric portions, but which resists flowing off the dielectric portions once applied, and hence it is preferable as a main component of the liquid dielectric material.

The objects, aspects and advantages will be apparent through a reading of the following detailed description.

BRIEF DESCRIPTION OF THE FIGURES

The organization and manner of the structure and operation of the Present Application, together with further objects and advantages thereof, may best be understood by reference to the following Detailed Description, taken in connection with the accompanying Figures, wherein like reference numerals identify like elements, and in which.

DESCRIPTION OF THE PREFERRED EMBODIMENTS

While the Present Application may be susceptible to embodiment in different forms, there is shown in the Figures, and will be described herein in detail, specific embodiments, with the understanding that the disclosure is to be considered an exemplification of the principles of the Present Application, and is not intended to limit the Present Application to that as illustrated.

In the embodiments illustrated in the Figures, representations of directions such as up, down, left, right, front, rear and the like, used for explaining the structure and movement of the various elements of the Present Application, are not absolute, but relative. These representations are appropriate when the elements are in the position shown in the Figures. If the description of the position of the elements changes, however, it is assumed that these representations are to be changed accordingly.

Figure 1:
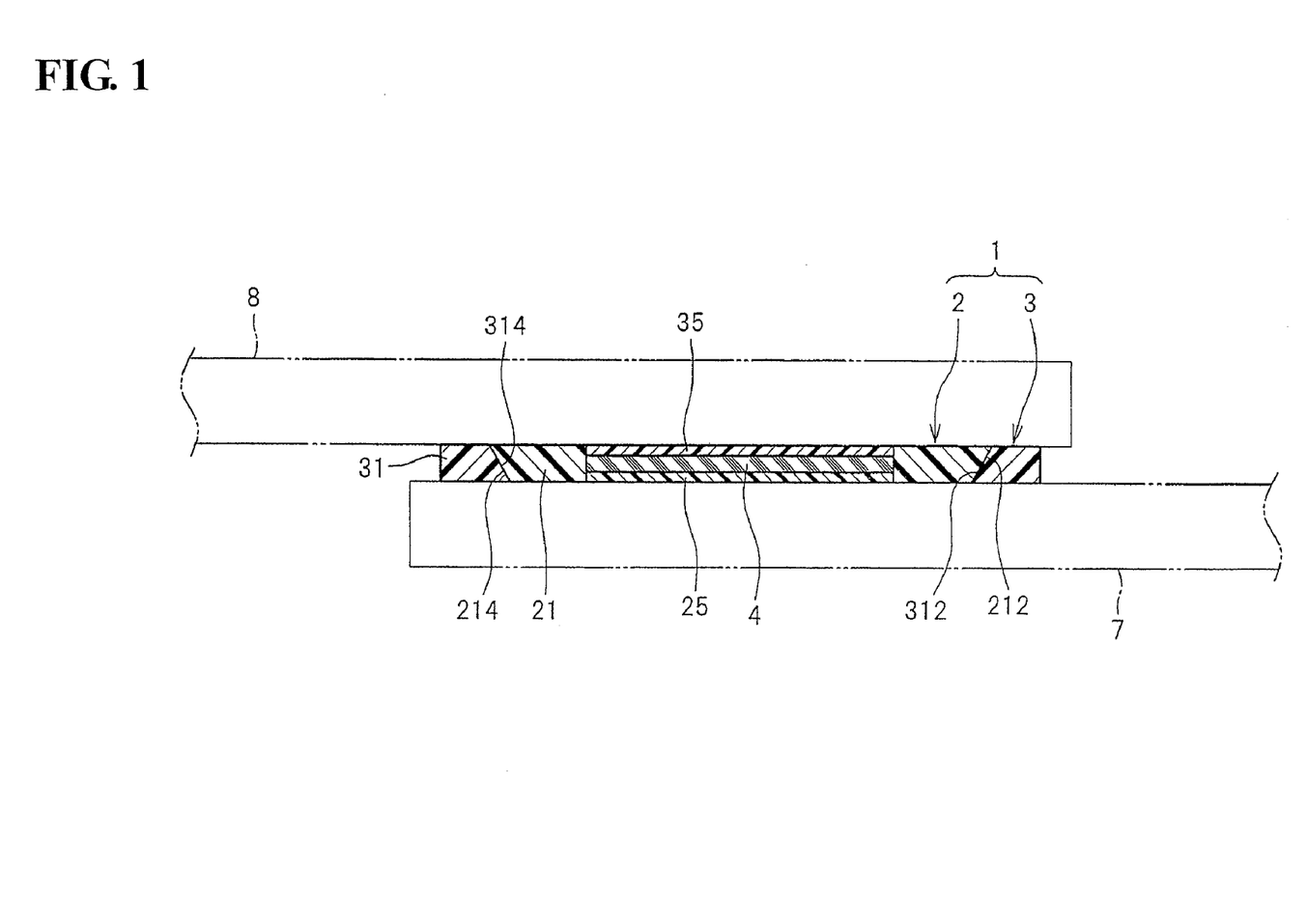
FIG. 1 is a sectional view of a connector assembly of the Present Application.

FIG. 1 is a sectional view of a connector assembly that finds utility in connecting together a first circuit substrate 7 and a second circuit substrate 8. The substrates 7, 8 may be flexible printed circuitry (FPC) or a printed wiring board, and respectively have a male connector 2 and a female connector 3 attached to the first and second circuit substrates 7, 8.

The male connector 2 has a first connector frame 21, and terminals 25 in the form of plates which serve as conductor portions of the connector 2. The terminals 25 are arranged in the first connector frame 21 in side by side order with open spaces separating adjacent terminals. Film-like dielectric portions or layers 4 are arranged on the contact surfaces of the terminals 25 that face the second connector frame 31 (upwardly). In contrast, the female connector 3 has a second connector frame 31, and plate-like terminals 35 serving as opposing portions are arranged in the second connector frame 31. Preferably the terminals 25 and 35 of the two connector frames are sized equally and the second connector frame terminals 31 also have flat contact surfaces within the second connector frame that face the first connector frame 21 (downwardly). Both connector frames 21, 31 are generally flat with a low profile.

When the first and the second connector frames 21, 31 are mated together, their respective terminals 25, 35 oppose each other. No direct metal to metal contact is made between the terminals 25, 35 because there are nonconductive, dielectric portions (layers) 4 which are interposed therebetween. As a result, capacitive-coupling between the opposing terminals 25, 35 is realized, which performs well to transmit high-frequency electrical signals between the circuits on the first and second circuit substrates.

Figure 2A:
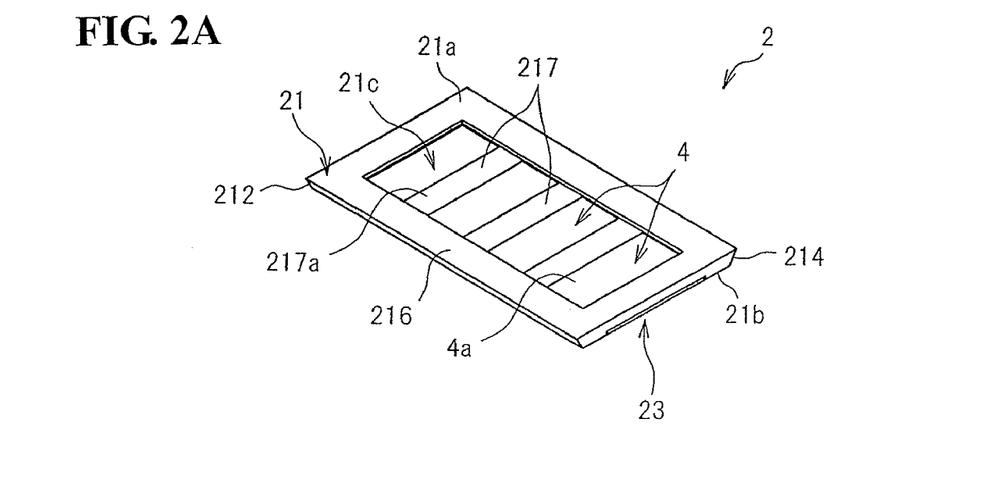
FIG. 2A is a perspective view of a male connector used in the connector of FIG. 1.
Figure 2B:
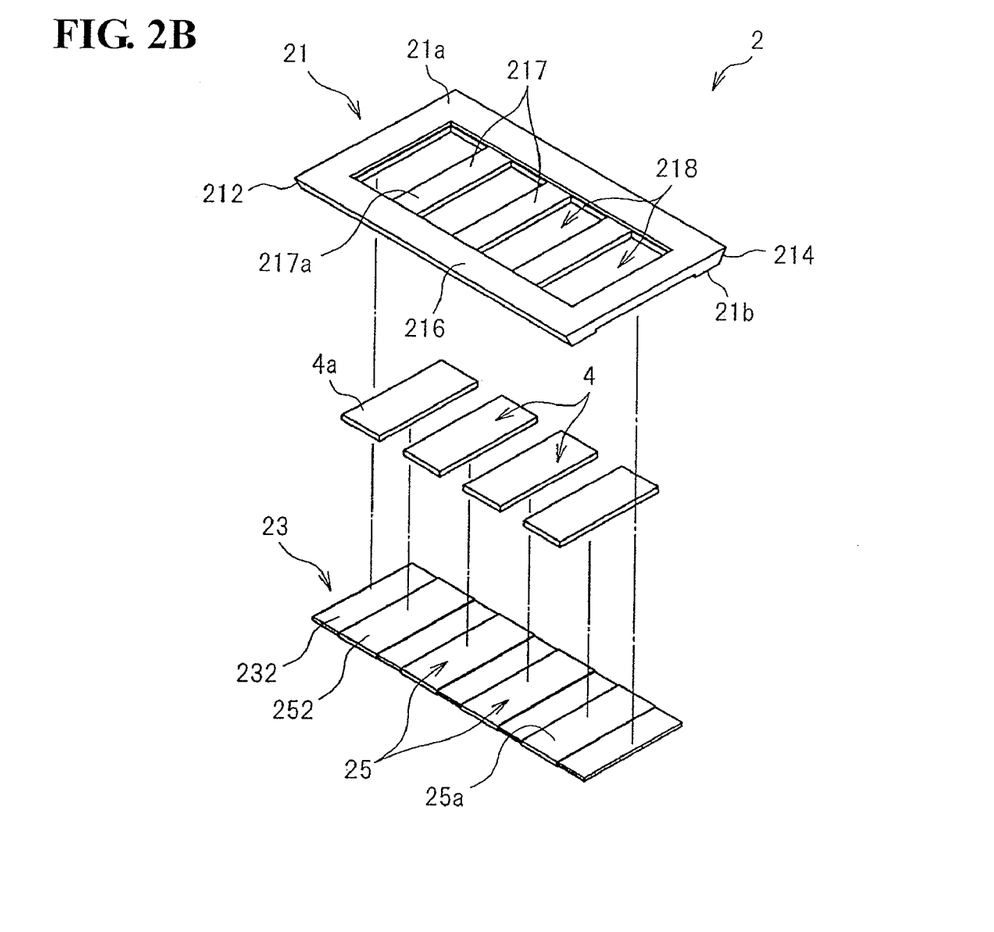
FIG. 2B is an exploded perspective view of the male connector of FIG. 2A.
Figure 2C:
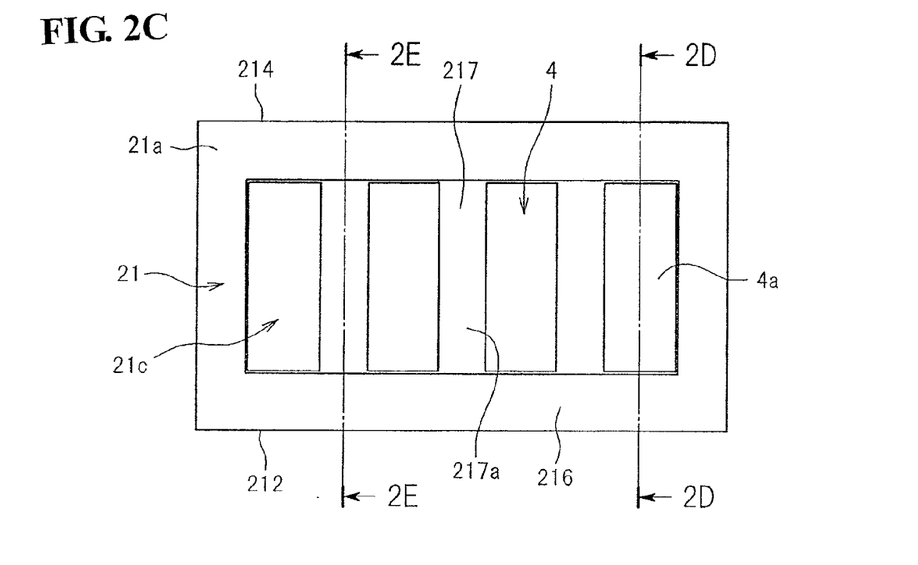
FIG. 2C is a top plan view of the male connector of FIG. 2A.

The male connector 2 has a first connector frame 21 made of a resin and formed into a ladder-like shape, with a terminal holder 23 provided with a plurality of conductive terminals 25, and dielectric portions 4 provided on at least the contact surfaces of the respective terminals 25.

The first connector frame 21 is generally rectangular with a frame portion 216 formed from two pairs of opposing, and preferably parallel sides. The first connector frame 21 includes a plurality of beam portions 217 that extend transversely between the sides of the first connector frame 21 and within the frame portion 216. Open spaces 218 are disposed alongside and between adjacent beam portions 217 and the end side members of the frame serve to separate, or isolate them from each other. The outer edges of the long sides of the frame portion 216 may have tapered portions 212, 214, respectively, which protrude on a top surface 21a side thereof outward with respect to a bottom surface 21b side thereof. The terminal holder 23 is attached on the bottom surface 21b side of the frame portion 216. The positions of the hole portions 218 correspond to the positions of the terminals 25, and the dielectric portions 4 are accommodated in the respective open spaces 218.

Figure 2D:
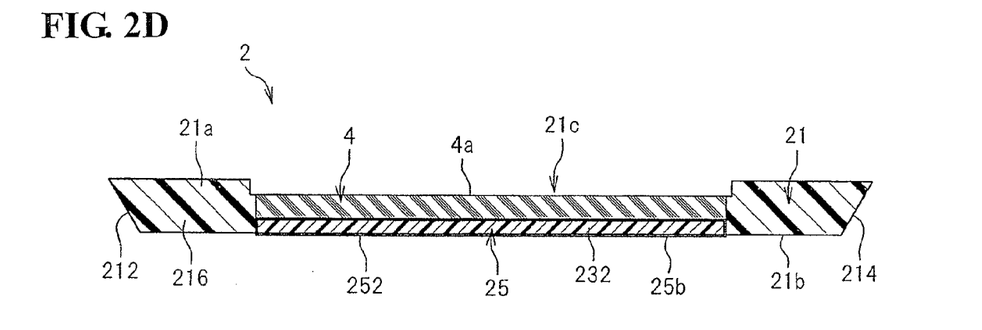
FIG. 2D is a sectional view of the male connector, taken along Line 2D-2D of FIG. 2C through a conductor and dielectric portion thereof.
Figure 2E:
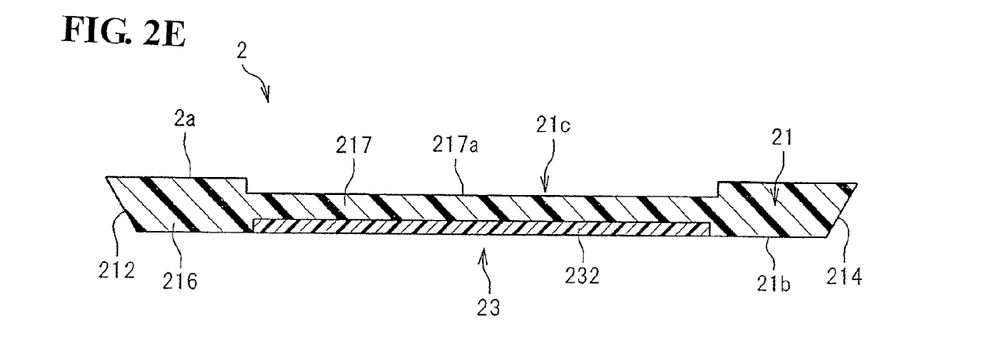
FIG. 2E is a sectional view of the male connector, taken along Line 2E-2E through a bridging portion thereof.

In this context, as illustrated in FIG. 2E, top surfaces 217a of the beam portions 217 are recessed with respect to the top surface 21a of the frame portion 216. Similarly, as shown in FIG. 2D, the top surfaces 4a of the dielectric portions 4 accommodated in the open spaces 218 are also recessed with respect to the surface 21a of the frame portion 216, and aligned with the surfaces 217a of the beam portions 217. The sides have a first preselected height and the terminals 325 have a second preselected height and the dielectric portions 4 have a third preselected height. The first preselected height is greater than the second and third preselected heights so that a recessed portion 21c which is surrounded by the frame portion 216 is defined in the first connector frame 2. The bottom of this recessed portion 21c is defined by the top surfaces 217a of the beam portions 217 and the top surfaces 4a of the dielectric portions 4. The recessed portion 21c constitutes an accommodating space that receives the terminals 35 of a female connector 3 described later, and also receives and contains a liquid dielectric material 45 that is applied to the dielectric portions 4.

The terminal holder 23 has a plate-like base member 232 made of an insulative resin and conductors that may take the form of films 252 wound around the plate-like base member 232, in a manner such that the conductor films 252 form the terminals 25. In one specific example, a nickel undercoat with a gold plating may be applied to the base member 232 which is formed from a bismaleimide-triazine (BT, and copper foils are used as the conductor films 252. The terminal holder 23 may also be formed by molding a metal plate to serve as the terminal 25 directly into the base member 232, such as by insert molding. Other means of manufacturing the terminals and base member may be used.

The dielectric portions 4 are made of a high dielectric material and preferably a ceramic one, such as tantalum pentoxide and/or barium titanate, and this material is bonded to top surfaces 25a of the terminals 25. In a specific example, copper layers are formed on the bottom surfaces of the dielectric portions 4 by evaporation or the like, and the copper layers are bonded to the top surfaces 25a of the terminals 25 by soldering or the like. With this construction, air layers are suppressed from being formed between the terminals 25 and the dielectric portions 4. Note that the dielectric portions 4 may be formed on the terminals 25 by sputtering or printing.

Figure 3:
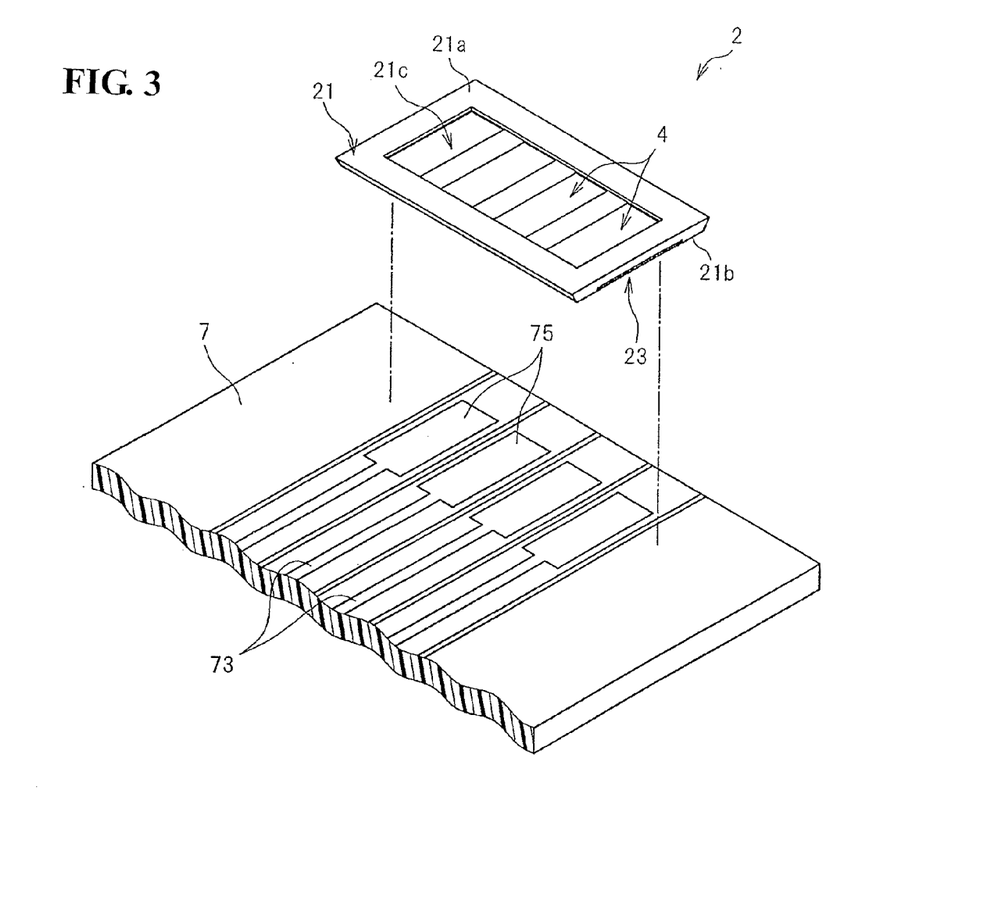
FIG. 3 is a perspective view illustrating how the male connector of FIG. 2A is mounted to a first circuit substrate.

FIG. 3 is a view illustrating how the male connector 2 is mounted to the first circuit substrate 7 which has a plurality of electrical circuits 73, and contact pads 75 are formed at end portions of the circuits 73. Each contact pad 75 is an exposed conductor present on the first circuit substrate 7, that is, a conductor pattern for connection. The bottom surface 21b of the first connector frame 21 is bonded to the top surface of the first circuit substrate 7, and the bottom surfaces 25b (see FIG. 2D) of the terminals 25 are connected to the contact pads 75 exposed on the first circuit substrate 7.

Figure 8:
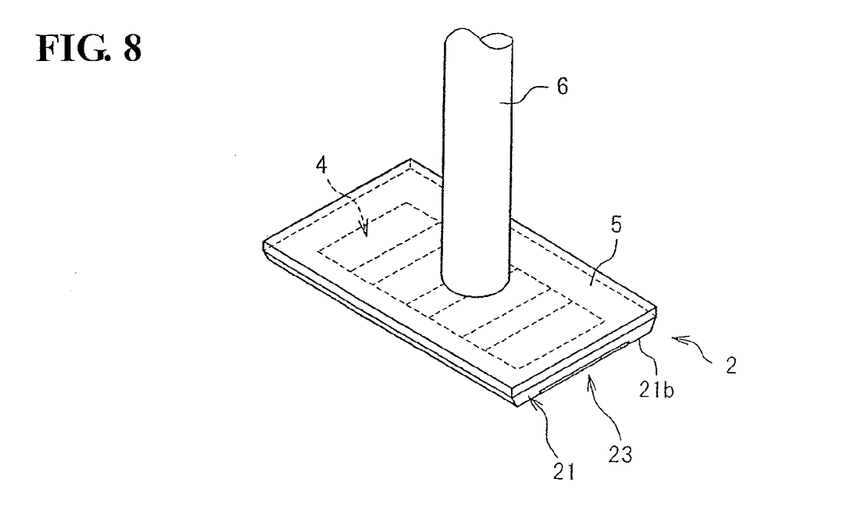
FIG. 8 is a perspective view illustrating how the connector assembly may be conveyed by a vacuum transfer mechanism.

Further, when positioned onto a first circuit substrate 7, the male connector 2 may be conveyed to its attachment position as shown in FIG. 8 by way of a vacuum pipe 6 which is part of an overall vacuum transfer mechanism. After the liquid dielectric material is applied to the top surfaces of the terminals in the recessed portion 21c, a cover film 5 is attached to the top surface 21a of the frame portion 216. The cover film 5 surrounds the recessed portion 21c, and closes it off. The sucker pipe 6 applies negative pressure to the film 5, to thereby support the male connector 2.

Figure 9:
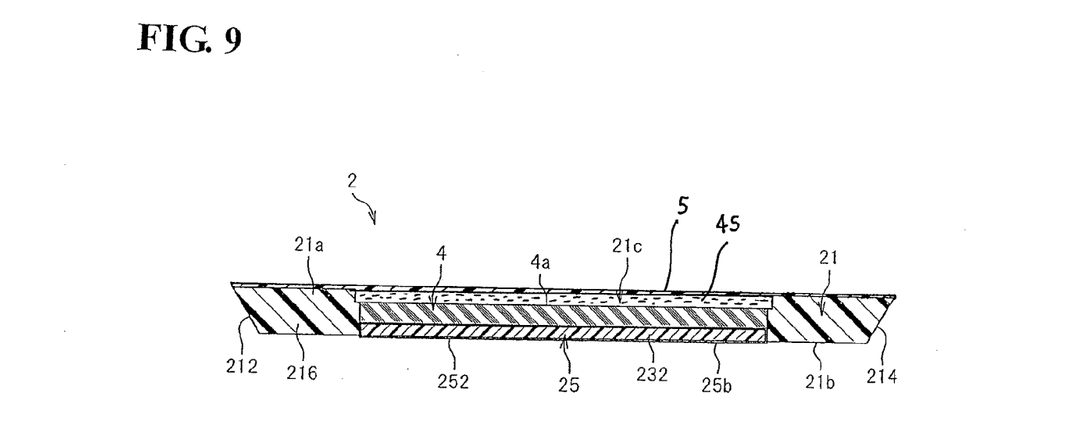
FIG. 9 is a sectional view through the first connector frame assembly of FIG. 8 along Line 9-9 thereof, illustrating the arrangement of the conductor, dielectric portion, liquid dielectric and cover film.

As described above and as best illustrated in FIG. 9, the recessed portion 21c is closed off by the cover film 5, so that the male connector 2 can be conveyed, with the liquid dielectric material 45 in place thereon and contained within the recessed portion 21c, while not being sucked into the vacuum pipe 6. Further, the cover film 5 also provides a means by which to suppress desiccation of the liquid dielectric material 45 in the recessed portion 21c. Further, the top surface 21a of the frame portion 216 is formed in the same plane, and hence gaps therebetween are less likely to be formed when the cover film 5 is attached, whereby the recessed portion 21c is easy to close off.

Figure 4A:
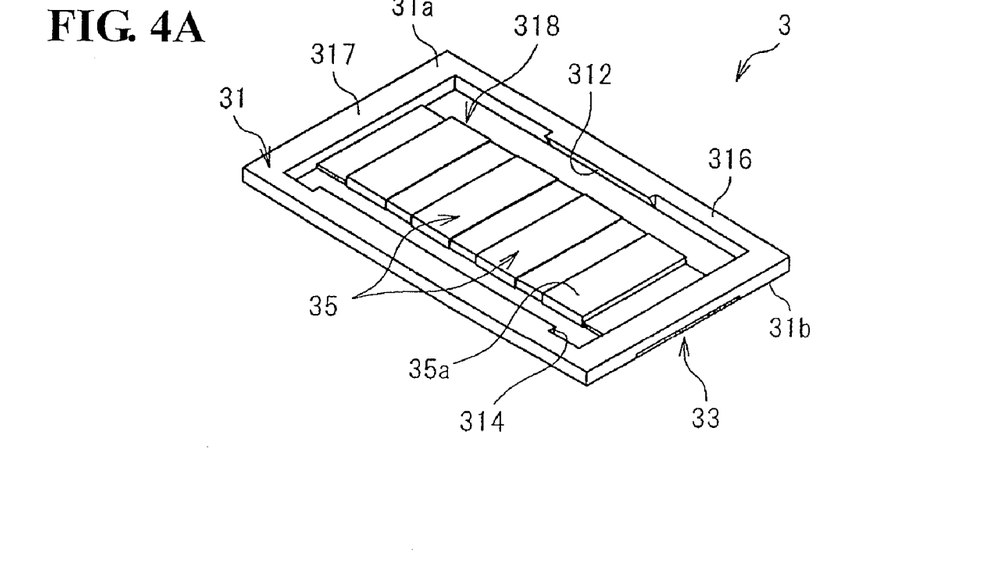
FIG. 4A is a perspective view of a female connector of the connector of FIG. 1.
Figure 4B:
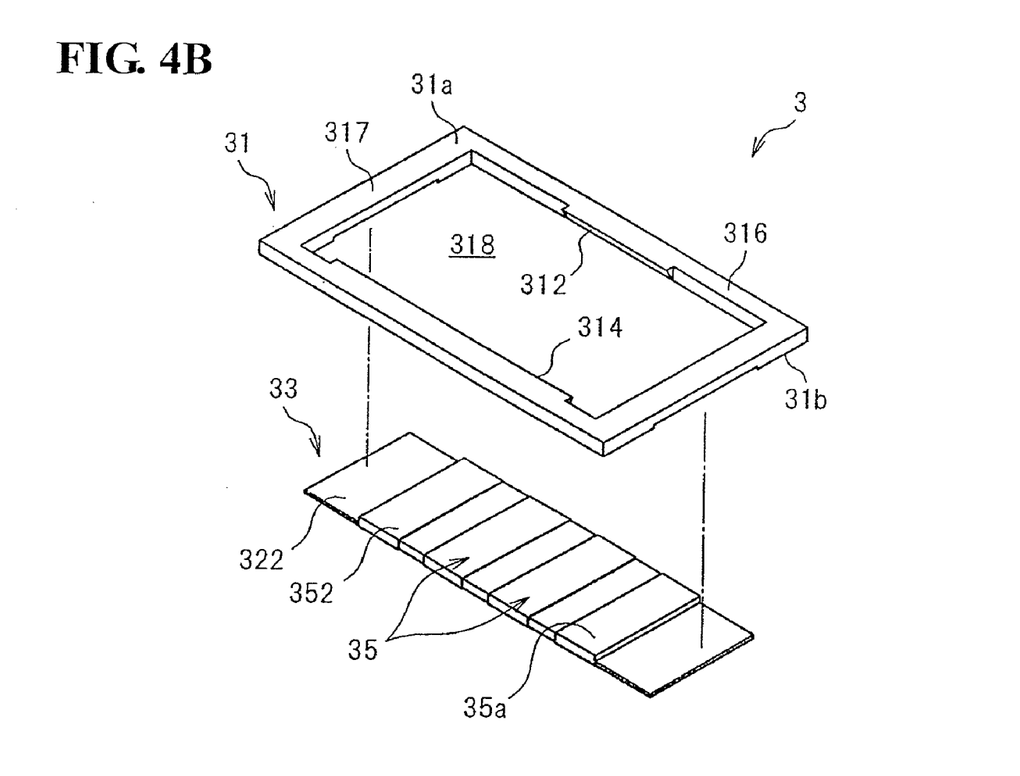
FIG. 4B is an exploded view of the female connector of FIG. 4A.

FIGS. 4A and 4B are a perspective view and an exploded perspective view of the female connector 3, respectively. The female connector 3 also has a rectangular second connector frame 31 having an adequate elasticity and made of an insulative resin, and a terminal holder 33 provided with the plurality of conductive terminals 35.

The second connector frame 31 has a pair of long side portions 316 and a pair of short side portions 317, and those side portions cooperatively surround a hole portion 318. The first connector frame 21 is fitted into this hole portion 318. The terminal holder 33 is attached on a bottom surface 31b side of the second connector frame 31. Further, at inner edges of the long side portions 316, there are respectively formed tapered portions 312, 314 extending inwards on a top surface 31a side with respect to the back surface 31b side.

Similarly to the above-mentioned terminal holder 23, the second connector terminal holder 33 also has a plate-like base member 332 made of a resin and may include conductor films 352 formed so as to be wound therearound, so that the conductor films 352 constituting the terminals 35. Note that, of the plate-like base member 332 and the conductor films 352, portions corresponding to the inner side of the recessed portion 21c of the first connector frame 21 are formed to be somewhat thicker than other portions toward the top surface 31a side.

Figure 5:
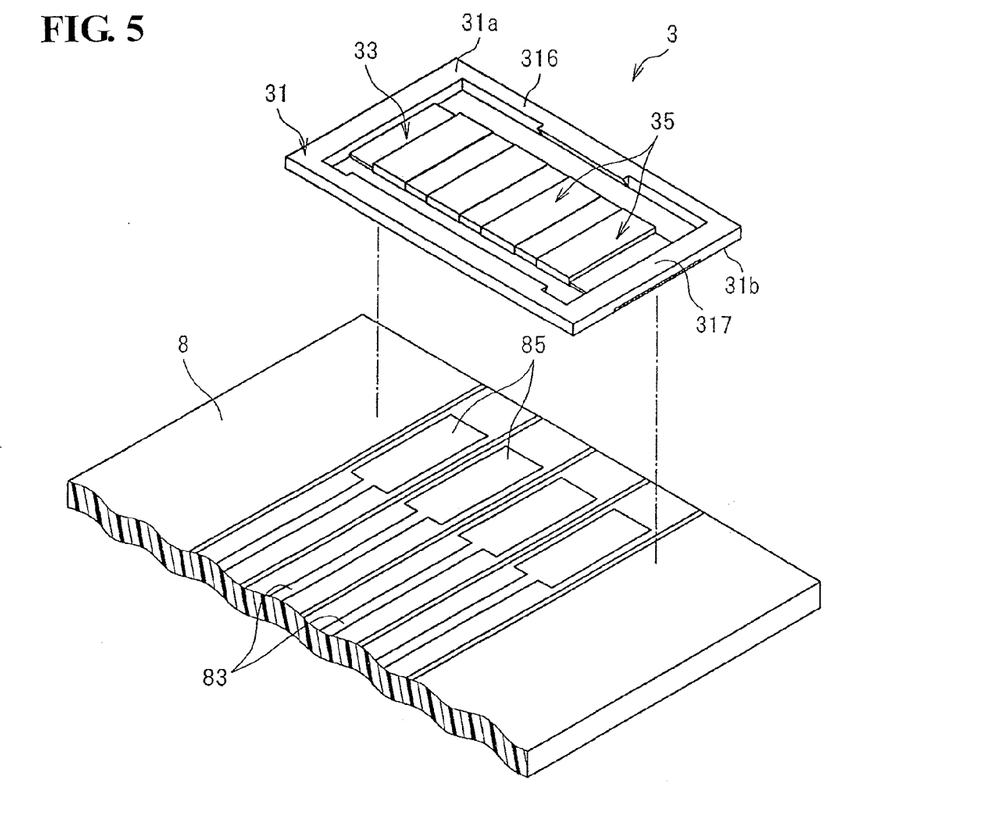
FIG. 5 is a perspective view illustrating how the female connector of FIG. 4A is mounted to a second circuit substrate.

FIG. 5 is a view illustrating how the female connector 3 is mounted to its respective second circuit substrate. Similarly to the above-mentioned first circuit substrate 7, the second circuit substrate 8 on which the female connector 3 is mounted has a plurality of electrical circuits 83, and contact pads 85 are typically formed at end portions of the electrical circuits 83. Each contact pad 85 is an exposed conductor pattern formed on the second circuit substrate 8, that is, a conductor pattern for connection. The bottom surface 31b of the second connector frame 31 of the female connector 3 is bonded to the top surface of the second circuit substrate 8, and the bottom surfaces of the terminals 35 are connected to the conductor pads 85 provided on the second circuit substrate 8.

Note that, in order to allow elastic deformation of the long side portions 316 of the second connector frame 31, it is preferable that, of the bottom surface 31b of the second connector frame 31, only the bottom surfaces of the short side portions 317 be bonded to the top surface of the second circuit substrate 8, and that the bottom surfaces of the long side portions 316 are not bonded to the top surface of the second circuit substrate 8.

The first connector frame 21 of the male connector 2 and the second connector frame 31 of the female connector 3, which are described above, are fitted together as illustrated above in FIG. 1. In this case, the terminals 35 of the female connector 3 are inserted into the recessed portion 21c formed on the front surface side of the first connector frame 21, and brought into contact with the dielectric portions 4 on the terminals 25 of the male connector 2. With this, the dielectric portions 4 are sandwiched between the terminals 25 and the terminals 35 opposed to each other.

Specifically, through fitting the tapered portions 212, 214 and the tapered portions 312, 314 together, the first connector frame 21 and the second connector frame 31 generate a mutual attracting force, whereby the dielectric portions 4 and the terminals 35 are brought into a reliable pressure contact with each other. Note that, the Present Application is not limited to such a mode, and may adopt a mode in which step-like members are fitted together.

Figure 6:
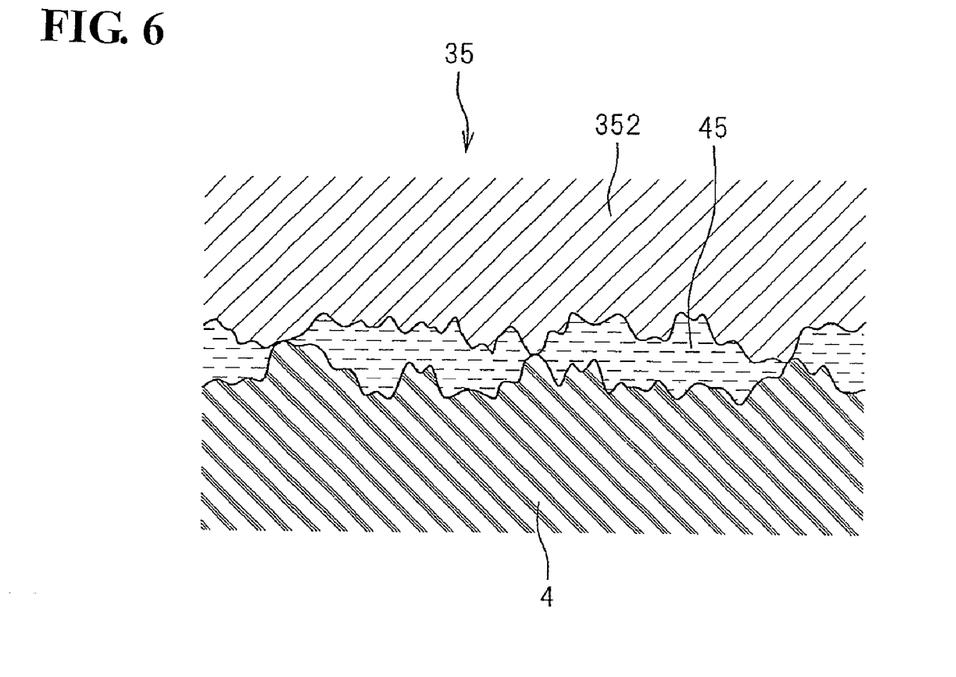
FIG. 6 is an enlarged detail view at a somewhat microscopic level, illustrating the contact which occurs between the dielectric portion disposed on one of the connector frames and an opposing, second conductor disposed on either the second connector frame or the second circuit substrate.

Further, the liquid dielectric material 45 is applied to the bottom surface in the recessed portion 21c of the first connector frame 21. Thus, as illustrated in FIG. 6, when the first connector frame 21 and the second connector frame 31 are fitted together, the liquid dielectric material 45 is interposed in minute gaps formed between the dielectric portions 4 and the terminals 35 (conductor films 352, specifically). The liquid dielectric material 45 is in a liquid state in a vicinity of room temperature, and has higher dielectric constant than that of air.

Specifically, as a main component of the liquid dielectric material 45, a glycol-based resin having relatively high dielectric constant is suitably used. Polypropylene glycol (PPG) of the Triol-type, M=1500, has been suitably used. This type of PPG has a viscosity of about substantially 200 to 500 mPa·s (200 to 500 centipoise) at 25° C., and does not easily stream down from the dielectric portions 4 or the terminals 35.

The main component of the liquid dielectric material 45 is not limited to a glycol-based resin. For example, silicone oil, petrolatum (petroleum jelly), or an acrylic resin may be used. In particular, silicone oil has excellent heating resistance, and hence silicone oil is suitable in view of manufacturing under high temperature.

According to the embodiment described above, the liquid dielectric material 45 is interposed in the minute gaps between the dielectric portions 4 and the terminals 35, and eliminates air and hence deterioration of capacitance between the terminals 25 and the terminals 35 is suppressed. Further, by using the liquid dielectric material 45, it is possible to contact the dielectric portions 4 and the terminals 35 with each other, and to fill the minutes gaps between the dielectric portions 4 and the terminals 35. Further, as illustrated in FIG. 4A, by using the liquid dielectric material 45, any short circuit between the terminals 35 in the crosswise, planar direction is suppressed even when the plurality of terminals 35 are aligned in a plane.

Further, the recessed portion 21c of the first connector frame 21 contains the liquid dielectric material and prevents it from flowing off of its intended surfaces. In practice a recessed portion with a depth of about 0.48 mm (0.189 inches) has provided suitable results. In this regard, the use of a recessed portion does not increase the overall height of its connector or the entire connector assembly.

Hereinbefore, while the embodiment of the Present Application is described, the Present Application is not limited to the above-mentioned embodiment. It is needless to say that various modifications can be made by those skilled in the art.

Figure 7:
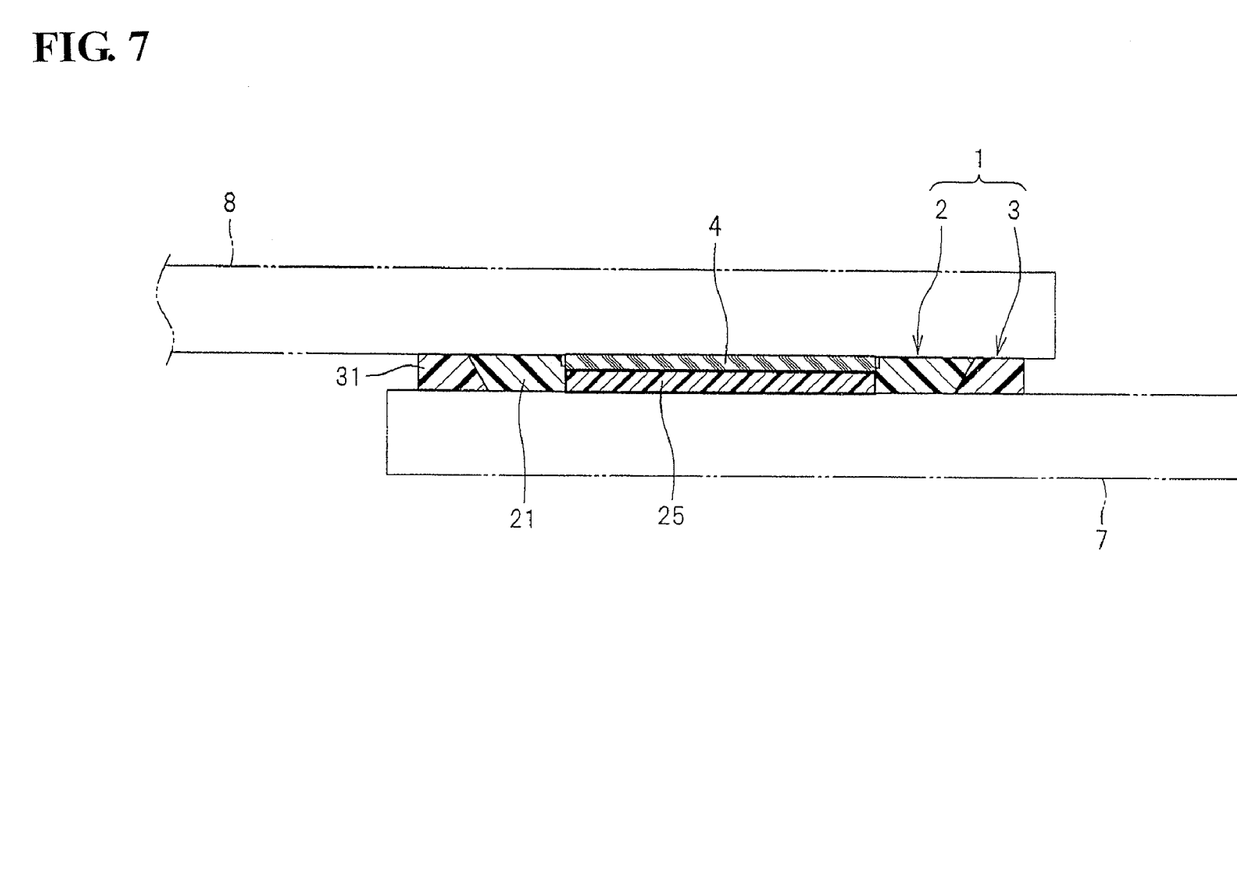
FIG. 7 is a sectional view of the connector assembly of FIG. 1.

For example, as illustrated in FIG. 7, the terminals 35 may be omitted from the above-mentioned construction illustrated in FIG. 1, and the dielectric portions 4 on the terminals 25 of the male connector 2 may be held in contact with the contact pads 85 (see FIG. 5) of the second circuit substrate 8, and the liquid dielectric material may be interposed in gaps therebetween.

Further, for example, in the above-mentioned construction illustrated in FIG. 1, the dielectric portions may also be provided on the terminals 35, the dielectric portions 4 on the terminals 25 of the male connector 2 may come into contact with the dielectric portions on the terminals 35 of the female connector 3, and the liquid dielectric material may interpose in the gaps therebetween.

Further, for example, in the above-mentioned construction illustrated in FIG. 1, the dielectric portions 4 may be provided not on the terminals 25 but on the terminals 35, and the liquid dielectric material may be applied to the top surfaces 25a of the terminals 25 that form the bottom of the recessed portion 21c.

While a preferred embodiment of the Present Application is shown and described, it is envisioned that those skilled in the art may devise various modifications without departing from the spirit and scope of the foregoing Description and the appended Claims.

What is claimed is:

1. A connector assembly, comprising:
a first connector frame mounted to a first circuit substrate;
a second connector frame for mounted to a second circuit substrate;
at least one first conductor disposed on the first connector frame and connected to an electrical circuit of said first circuit substrate; and
at least one dielectric portion provided in confronting relationship to the first conductor;
characterized in that, when said first and second connector frames are mated together, the dielectric portion also confronts an opposing, second conductor of said second connector frame, and a liquid dielectric material is interposed between said second opposing conductor and said dielectric portion, and whereby at least one of said first and second connector frames includes a recessed portion that defines a reservoir that retains said liquid dielectric in place.

2. The connector assembly according to claim 1, wherein said first conductor has a plate-like shape with two opposing contact surfaces disposed thereon, one of said two contact surfaces being connected to the first circuit substrate electrical circuit, and the dielectric portion is disposed on the other of said two contact surfaces.

3. The connector assembly according to claim 1, wherein said opposing, second conductor has a plate-like shape with two opposing contact surfaces, one of the second conductor contact surfaces being connected to the second electrical circuit substrate, and the dielectric portion is disposed on the other of said second conductor contact surface.

4. The connector assembly according to claim 1, wherein said recessed portion is disposed in said second connector frame and said opposing second conductor is disposed on said second circuit substrate within said recessed portion, and said liquid dielectric material is arranged on said opposing, second conductor.

5. The connector assembly according to claim 1, further including a film cover that covers said recessed portion.

6. The connector assembly according to claim 1, further including a plurality of first conductors disposed in said first connector frame and a plurality of dielectric portions disposed within said recessed portion, on contact surfaces of said first conductors, and said liquid dielectric material being disposed on each of said dielectric portions.

7. The connector assembly according to claim 1, wherein said first connector frame includes first and second pairs of opposing sides, the first and second pairs of opposing side cooperatively defining the recessed portion, and said dielectric portion being disposed in said first connector frame so as to define a bottom surface of said reservoir.

8. The connector assembly according to claim 7, wherein said opposing second conductor is inserted into said recessed portion and into contact with said dielectric portion and said liquid dielectric material when said first and second connector frames are mated together.

9. The connector assembly according to claim 7, wherein said first and second pairs of opposing sides lie in a common plane and define a flat border surrounding said recessed portion.

10. The connector assembly according to claim 1, wherein said liquid dielectric material is chosen from the group consisting of glycol-based resin, silicone oil, petroleum jelly and acrylic resin.

11. The connector assembly according to claim 10, wherein said liquid dielectric material has a viscosity of between substantially about 200 to substantially about 500 centipoise.

12. A connector, comprising:
a body portion having first and second pairs of opposing side members, all of the side members being interconnected together so as to define an open recessed portion in the connector body portion, the side members having a first preselected height;
a plurality of first conductors disposed within the recessed portion, the first conductors having first contact surfaces, the first contact surfaces being disposed within said recessed portion at a second preselected height;
a plurality of dielectric portions disposed on the first contact surfaces at a third preselected height;
a liquid dielectric material disposed on at least said dielectric portions; and
the first preselected height being greater than said second and third preselected heights so as to define a reservoir for containing said liquid dielectric therewithin in contact with said dielectric portions.

13. The connector of claim 12, further including a cover film layer disposed on said side members and covering said recessed portion.

14. The connector of claim 12, wherein said body portion includes a plurality of bridging portions extending between the first pair of said side members and a plurality of open spaces arranged in alternating fashion so as to separate said bridging portions from each other and the second pair of said side members.

15. The connector of claim 12, further including a base portion supporting said first conductors, the base portion defining a bottom of said reservoir.

16. The connector according to claim 15, wherein said first conductors are disposed on said base portion.

* * * * *